United States Patent [19]
Martin

[11] Patent Number: 5,113,701
[45] Date of Patent: May 19, 1992

[54] TRANSPORT DEVICE FOR BOARDS HAVING A SENSITIVE SURFACE, ESPECIALLY FOR WET-COATED CIRCUIT BOARDS

[75] Inventor: Peter Martin, Basel, Switzerland

[73] Assignee: Ciba-Geigy Corporation, Ardsley, N.Y.

[21] Appl. No.: 647,322

[22] Filed: Jan. 29, 1991

[30] Foreign Application Priority Data

Feb. 5, 1990 [CH] Switzerland ............... 362/90

[51] Int. Cl.⁵ .................................................. B05C 1/02
[52] U.S. Cl. .......................... 118/58; 118/324; 118/500; 118/DIG. 4; 198/803.14
[58] Field of Search ............... 118/58, 500, 301, 322, 118/324, 677, DIG. 4, 423, 428; 198/483.1, 803.14, 803.15

[56] References Cited

U.S. PATENT DOCUMENTS 4,757,892 7/1988 Wenger .............................. 198/404
4,926,789 5/1990 Wenger et al. ...................... 118/668

FOREIGN PATENT DOCUMENTS

2439734 10/1978 France.

Primary Examiner—Kenneth M. Schor
Assistant Examiner—Charles K. Friedman
Attorney, Agent, or Firm—Luther A. R. Hall; Harry Falber

[57] ABSTRACT

A transport device for boards having a sensitive surface, especially for wet-coated circuit boards, comprises, within a common housing, a lacquering station and, arranged above the latter, a drying region. For transporting the boards (2) through the drying region holders (3) are provided which comprise at least two bars (30) each having rows (31,32) of prongs extending from a bar (30) in a "V" shape and arranged in the form of a rake. The free ends of the prongs of the one bar point towards the free ends of the prongs of the other bar. The bottom ends of the holders (3) are open. For supporting the bottom ends (2b) of a board (2) that is being transported in a holder (3), the transport device is equipped with a supporting device (12) that is movable synchronously with the holders (3).

35 Claims, 6 Drawing Sheets

TRANSPORT DEVICE FOR BOARDS HAVING A SENSITIVE SURFACE, ESPECIALLY FOR WET-COATED CIRCUIT BOARDS

The invention relates to a transport device for boards or board-shaped workpieces having a sensitive surface, especially for circuit boards that are wet-coated with plastics material, for example UV-hardenable plastics material, with lacquer or the like, according to the preamble of patent claim 1.

Various devices for holding and transporting boards or board-shaped workpieces which are intended to allow for the surfaces of the boards to be treated with care are known. This is especially necessary when wet-coated circuit boards are to be transported from the coating station to the drying station. Such circuit boards are coated with a protective lacquer which is first of all dried, then exposed and developed at the unexposed areas.

After being coated, such boards must be aired and dried. A problem encountered especially with circuit boards in which both surfaces have to be coated and correspondingly treated is that, during coating of the second surface, the coating on the first surface has not yet hardened and is therefore susceptible to damage.

There is known from FR-A-2 439 734 a transport device for circuit boards having printed circuits that has an endless conveyor with a chain drive, wherein the boards in the region of the top run of this conveyor element project into slots which are open at the top, so that their surfaces are oriented approximately vertically. Only one longitudinal edge of the board is held is this case. A conveyor device of that kind would be unsuitable for freshly coated boards since at least some of the coating fluid would run down the surface and could form runs and tears.

U.S. Pat. No. 4,757,892 describes a circuit board coating system in which the individual treatment stations are arranged in succession. Transport of the circuit boards is effected by means of conveyor belts or transport rollers and, in the drying station, with the aid of circulating board carriers. The board carriers are of forked construction in order to receive the circuit boards. The circuit boards are in this case inserted by their longitudinal edges into longitudinal grooves in the fork arms of the board carriers. Whilst the coating on the circuit boards is to a great extent treated in a non-damaging manner in this way, the insertion of the circuit boards into the longitudinal grooves in the board carriers requires comparatively great precision. Adaptation of the board carriers to different sizes (widths) of board also involves a certain amount of additional effort. Two lacquering stations and, accordingly, at least two drying stations are required in order to coat a circuit board on both sides. The system is relatively complex and, in particular, requires a lot of space.

There is known from U.S. Pat. No. 4,926,789 a transport device of the kind mentioned at the beginning in which there are provided as holders grips or clips which have a separably coupled holding element which can be transferred or translocated, together with the board that is being held, at each of the transitions from one advancing means to another and from one treatment station to another. Although the boards can thereby be held in a non-damaging manner in a coating-free edge region and are able to remain connected to their holders throughout the entire treatment, high expenditure on machinery and control technology is required in order to ensure continuous operation of a corresponding transport device. The coating of such boards on both sides requires two lacquering stations to be arranged in succession, between which a separate drying station must be arranged so that the first coating can first achieve a stability sufficient to allow the board to be transported further to the second lacquering station. Furthermore, precautions must be taken to ensure that the holders for the boards can always be coupled on and uncoupled at the right time and, after passing through the entire transport device, transported back to the starting point at the right time in order to be able to receive further boards at that point. This known system is relatively complex with regard to its construction and also occupies a relatively large amount of space.

The problem is therefore to provide a transport device of the kind mentioned at the beginning in which the advantage that the holders touch only uncoated areas of the boards is retained, but the construction and production engineering and also the handling of those holders are simplified, and in which the holders provide the possibility of simplifying the entire transport device and reducing the amount of space that it requires.

The solution to this problem resides in constructing the transport device in accordance with the second part of patent claim 1. In particular, the transport device is equipped with holders that have at least two parallel bars on each of which there are provided two rows of prongs arranged in the form of a rake. The prongs of the one row of a bar form an acute angle with those of the second row of that bar. The two rows of prongs of a bar are arranged in a "V" shape with respect to each other when viewed in cross-section. The free ends of the prongs of the one bar point approximately towards the free ends of the prongs of the other bar in such a manner that, at least over part of the region located between the bars, the width of the gap between the rows of prongs which increases towards the longitudinal middle plane between the two parallel bars is greater than the thickness of a board to be held. The bottom ends of the holders are open in order to enable the holders to be loaded and unloaded in a simple manner. For supporting the bottom ends of the boards which are transported inside the holders, the transport device is equipped with a supporting device that is movable synchronously with the holders. This supporting device is preferably in the form of cables, link chains or circulating belts arranged in each case in the region of the open, bottom end of the holders.

The entire transport device according to the invention is arranged in one line, with an integrated pouring table and a venting, drying and cooling section arranged substantially above the pouring table.

The further patent claims relate to preferred variants of the transport device.

The invention and its essential details are described in detail below with reference to an embodiment. In the drawings, some of which are schematic:

BRIEF DESCRIPTION OF THE DRAWINGS

FIG. 7 is a top plan view of the transport device along the section line VII—VII in FIG. 6.

A transport device for boards 2 or board-shaped workpieces, especially those having a sensitive surface, for example for circuit boards that are to be coated with plastics material or lacquer and then dried, which transport device is designated 1 overall in FIGS. 6 to 9, has as essential elements especially the holders 3, shown in FIGS. 1 to 5, for taking hold of the boards 2 at the edges thereof when handling them, and synchronously circulating supporting devices for the bottom ends of the circuit boards 2, especially in their horizontal transport phase in which the circuit boards 2 are vertical in the holders 3. The holders 3 are fastened to circulating advancing means, in the embodiment endlessly circulating chains 4, for transporting the holders 3 and the boards 2 through various treatment stations which are yet to be described, such as a pre-drying station 5, a drying station 6 and a cooling station 7. Additionally integrated into the device 1 are transverse conveyors 15 with which the circuit boards 2 can be inserted into and removed from the transport device 1 at insertion and discharge stations 16 and 17, respectively.

In order that the boards 2 cannot be damaged on their sensitive surface when they are being handled, especially after a coating operation, the construction of the holders 3 is of fundamental importance in many respects. On the one hand, when the boards 2 are being transported in the holders 3, they should not be touched on the coated surface but, on the other hand, it must be possible to insert the boards 2 into the holders 3 and remove them from the holders 3 again without any problem.

Figure 1:
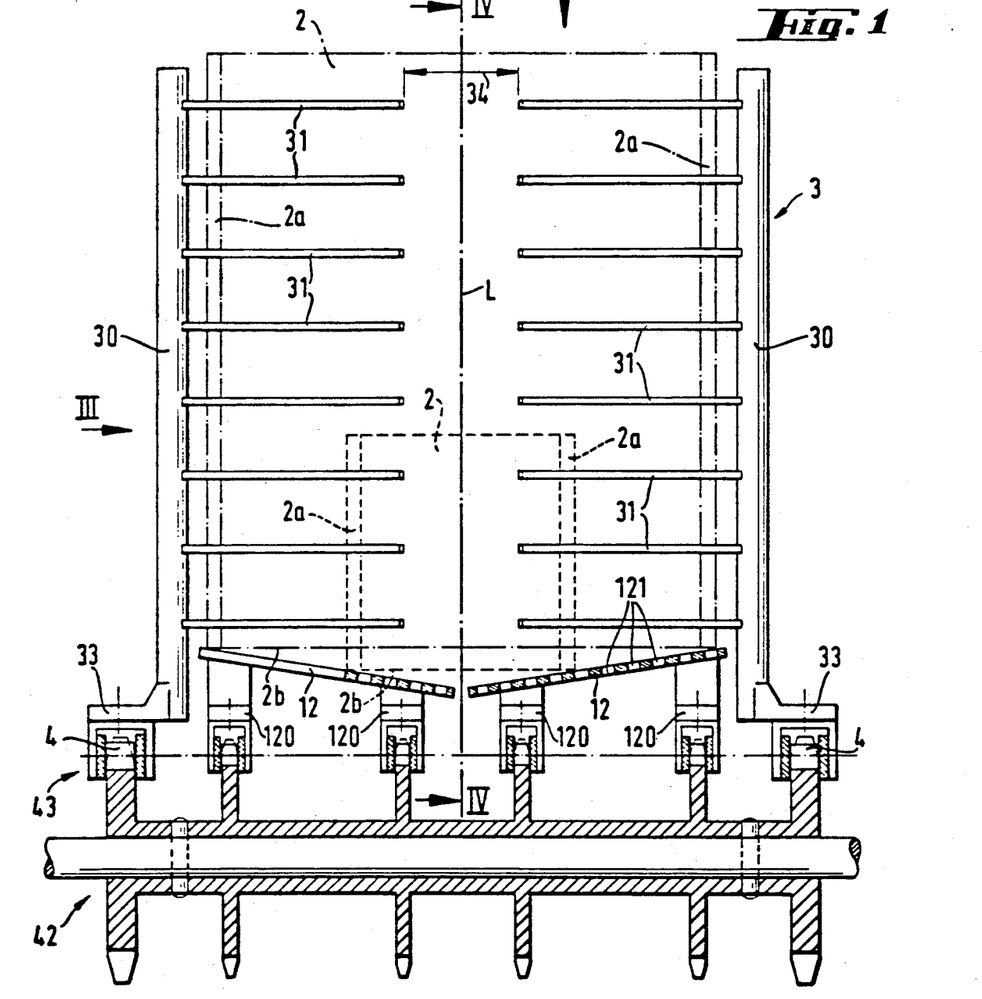
FIG. 1 shows a holder with a supporting device illustrated in cross-section.
Figure 2:
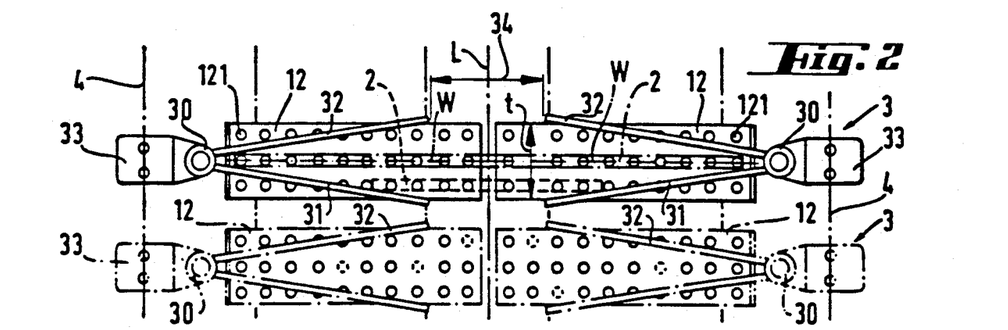
FIG. 2 is a top plan view of the holder shown in FIG. 1 with the supporting device being indicated.
Figure 3:
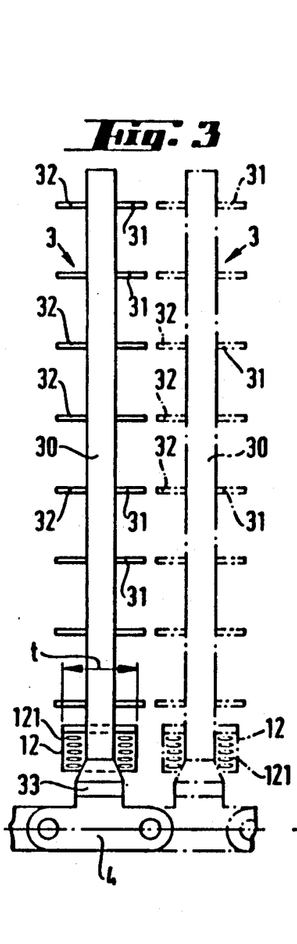
FIG. 3 is a side view of the holder according to the arrow III in FIG. 1.

According to FIGS. 1 to 5, each holder 3 therefore has two parallel bars 30 on each of which there are provided two rows 31 and 32 of prongs arranged in the form of a rake. As shown in FIG. 2, the prongs of the one row 31 of a bar 30 form an acute angle with those of the second row 32, that is to say, viewed in cross-section, the two rows 31 and 32 are arranged in a "V" shape with respect to each other. The free ends of the prongs of the one bar 30 point towards the free ends of the prongs of the other bar 30, as will again be seen clearly in FIG. 2. The width of the gap between the two rows 31 and 32 of prongs belonging to one bar 30, therefore, increases towards the longitudinal middle plane, indicated in FIGS. 1, 2 and 5 as a dot-dash line L, between the two bars 30.

Figures 4, 5:
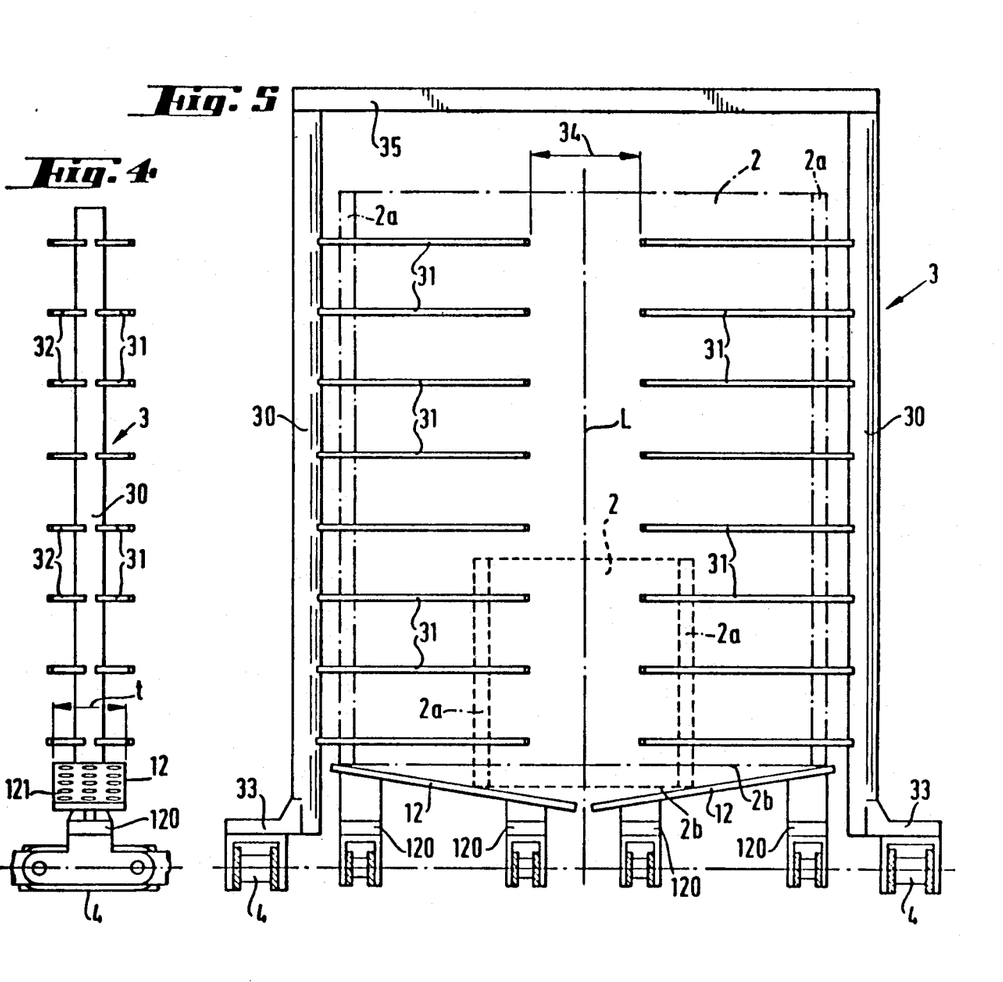
FIG. 4 is a section through the longitudinal middle plane of the holder along the line IV—IV in FIG. 1.
FIG. 5 shows a further embodiment of a holder having bars that are connected at one end and with the supporting device being indicated.

A board 2 is indicated by dashed lines in FIGS. 1, 2 and 5, FIGS. 1 and 5 also showing the lacquer-free edges 2a extending parallel to the bars. FIGS. 1 and 5 show with a dashed line a very small board 2 that can be taken hold of by a holder 3 and, with a dot-dash line, a very large board 2. It becomes clear in FIG. 2 that, over a large part of the region located between the bars 30, the width of the gap between the rows 31 and 32 of prongs which increases towards the longitudinal middle plane L is greater than the thickness of the boards 2 to be held, with the result that the surfaces of those boards 2 do not rest on the prongs even if a circuit board sags.

Immediately at or adjacent to a bar 30, the width of the gap between the respective rows 31 and 32 of prongs arranged in a "V" shape with respect to each other is smaller than the thickness of a board, at a transition point, namely the point of contact of the board 2 with the prongs, which is indicated in FIG. 2, said width is the same as the thickness of a board and, adjacent thereto—closer to the longitudinal middle plane L of the holder 3—said width is greater than the thickness of a board. It is not imperative, however, for a board 2 to touch all the prongs of both rows 31 and 32 with its longitudinal edges at the same time, as shown in FIG. 2 for the largest possible board 2, but a smaller board will in each case touch only the lower prongs of a holder 3.

The rows 31 and 32 of prongs are arranged parallel to each other and at right angles to the bar 30. In each case two prongs extending at an acute angle approximately from the same point on the bar 30 lie in a plane arranged at right angles to the length of the bars 30 and also at right angles to the longitudinal middle plane L, as becomes clear especially from FIGS. 3 and 4. The two bars 30 with their rows 31 and 32 of prongs arranged in a "V" shape and pointing towards each other are arranged mirror-symmetrically with respect to the longitudinal middle plane L extending between the bars 30, so that the supporting of a board 2 on the holder is always the same irrespective of the orientation of the holder.

In FIG. 2 it will also be seen that the bisectors W of the acute angles formed by the prongs of the one bar 30, which prongs are straight in the embodiment, coincide with those of the angles formed by the prongs of the other bar 30. Both bisectors W continue in a straight line, so that all the bisectors W of the acute angles formed in each case by the prongs of the bars 30 lie in a common plane with the bars 30, which plane is intersected by the longitudinal middle plane L and to which plane that longitudinal middle plane L is arranged at a right angle.

The space between prongs arranged adjacent to one another in the rows 31 and 32 is greater than the lateral extent of those prongs and is, for example, from five to ten times, especially seven or eight times, the diameter or width of a prong. According to the embodiments shown, the prongs are straight, but it is also possible for them to be curved, the curvature thereof advantageously lying in the plane that is shown in plan view in FIG. 2.

Between the free ends of the prongs of a holder 3, which prongs lie opposite each other preferably exactly in a common plane, a gap 34 is provided (cf. FIGS. 1 or 5) which is smaller than the smallest width of a board or circuit board 2 that is to be held. The size of that gap 34 is preferably approximately from one sixth to one quarter, especially one fifth, of the distance between the two parallel bars 30.

The spacing of the bars 30 from each other and therewith also the gap 34 may, however, also be adjustable (not shown). This allows adaptation to boards 2 that differ from each other in their dimensions even more widely than do those shown in FIGS. 1 and 5.

According to FIGS. 1 to 5, the bars 30 have coupling pieces 33 at their bottom ends, with which the holders 3 can be fastened to the circulating advancing means, especially the endlessly circulating transport chain 4 in this case.

The embodiments of holders 3 shown in FIGS. 1 and 5 are open at their bottom end which is towards the advancing chains 4. Constructed in this manner, the holder 3 allows the circuit board 2 to be inserted and removed horizontally in a simple manner, which insertion and removal will be described in more detail hereinbelow. The opposite, front end of the holders 3 may also be open, as shown in FIGS. 1 to 4. For reasons of better rigidity of the holders 3, however, the bars 30 can also be connected at the opposite, front ends by a connecting piece 35 which is welded on, screwed on or otherwise fastened, as is shown in FIG. 5.

In order to prevent a circuit board 2 that is in a holder 3 from slipping out through the open, bottom end of the holder 3, which is towards the chains, as the vertical transport of the holders 3 in the horizontal orientation changes to the horizontal transport of the holders 3 in the vertical orientation, the transport device 1 is equipped with a supporting device 12 which circulates synchronously with the advancing means, in this case the transport chain 4 with the holders 3 fastened thereto. This supporting device 12 is narrower than the width of the gap between the two bars 30 of a holder 3 and, during the horizontal transport and during the transition from the horizontal to the vertical transport of the holders 3, is always arranged in the region of the open, bottom ends of the holders 3. The supporting device 12 is constructed in the form of endlessly circulating chains, belts, cables or the like. In the embodiment shown in FIGS. 1 to 5, the supporting device 12 comprises two link conveyors which are inclined at an obtuse angle to each other in a "V" shape and are connected to the advancing means via guide means 120. The depth t of the individual links of the link conveyors 12 is preferably matched to the widest spacing of the forward ends of the prongs 31, 32, arranged in a "V" shape, of a bar 30 and corresponds to that spacing. The link conveyors have perforations 121 which allow air to be transported through the link conveyors largely unimpeded. At the transition from the vertical to the horizontal transport and vice versa and during the horizontal transport of the holders 3, the link conveyors 12 serve as a stop for the circuit boards 2 moved from the horizontal position into the vertical position. The bottom ends 2b of the circuit boards 2 are supported on the two link conveyors 12 arranged in a "V" shape with respect to each other. The obtuse angle at which the two link conveyors are inclined to each other results in substantially only the lacquer-free regions of the bottom ends 2b of the boards 2 resting on the link conveyors 12; ideally, there is only linear contact at the lacquer-free areas. This ensures that no contamination of the link conveyors 12 by adherent lacquer can occur.

The advance of the endlessly circulating link conveyors 12 is controlled in such a manner that it is completely synchronous with the advance of the holders 3. The two advancing means are preferably coupled, for example by coupling the link conveyors 12 and the endlessly circulating chains 4 at the turning points 42 in the top run 43. This coupling could be effected, for example, by means of common turn rollers. Instead of link conveyors 12 inclined to each other in a "V" shape, the supporting device could also comprise several endlessly circulating cables or chains that are staggered in level so that, in cross-section, a "V"-shaped alignment similar to that of the two link conveyors is achieved.

FIGS. 6 to 9 show a transport device 1 for circuit boards. The transport device 1 comprises holders 3 according to the embodiment shown in FIGS. 1 to 4 which are mounted on endlessly circulating chains 4. The endlessly circulating supporting device is designated 12. The endlessly circulating chains 4 and the endlessly circulating supporting device 12 are guided over common, symbolically indicated turn rollers 42 and are coupled in that manner. As a result, their advance, which usually takes place in steps, is fully synchronous.

Figure 6:
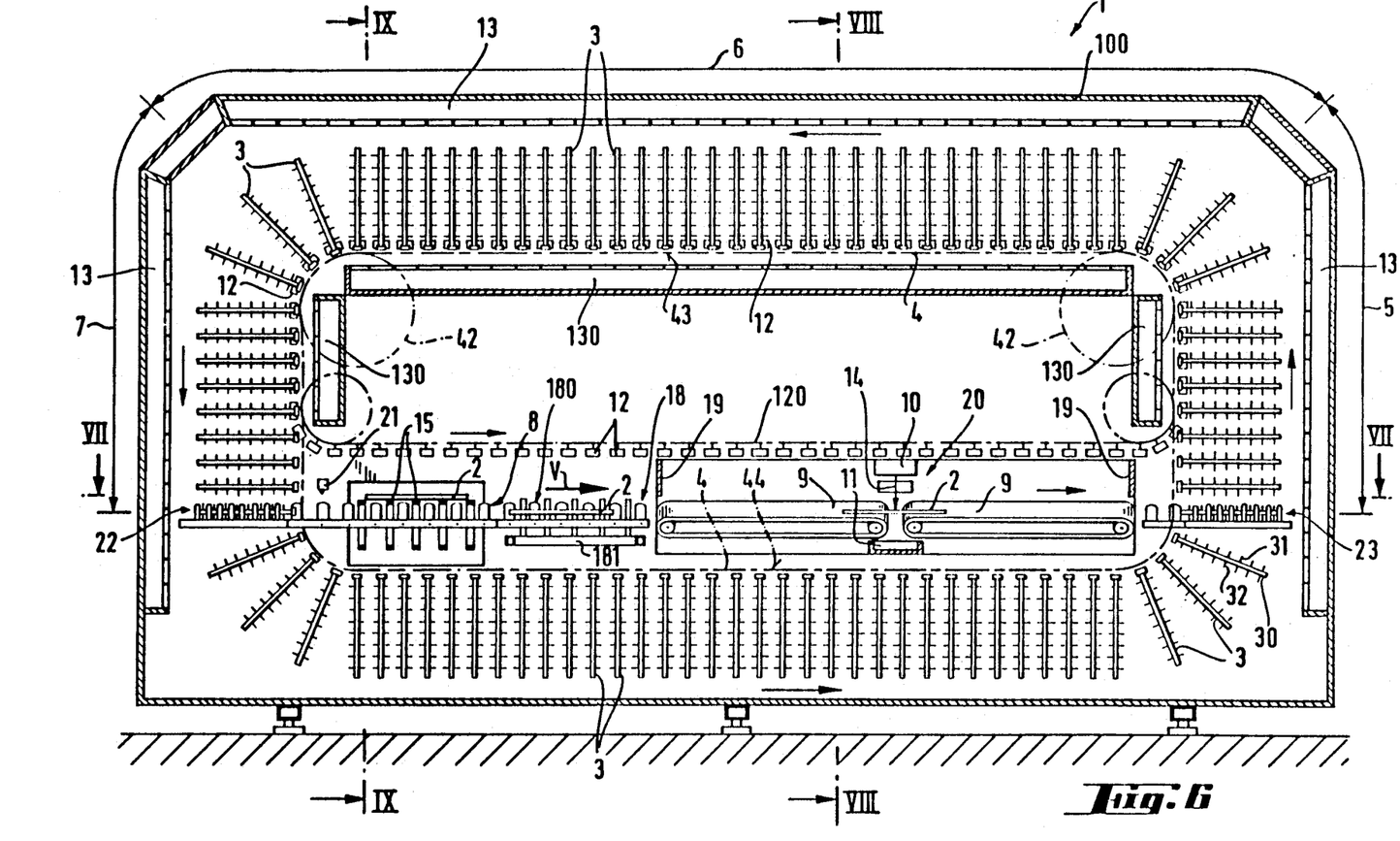
FIG. 6 shows a longitudinal section through a transport device for boards, having the holders shown in FIG. 1.
Figure 8:
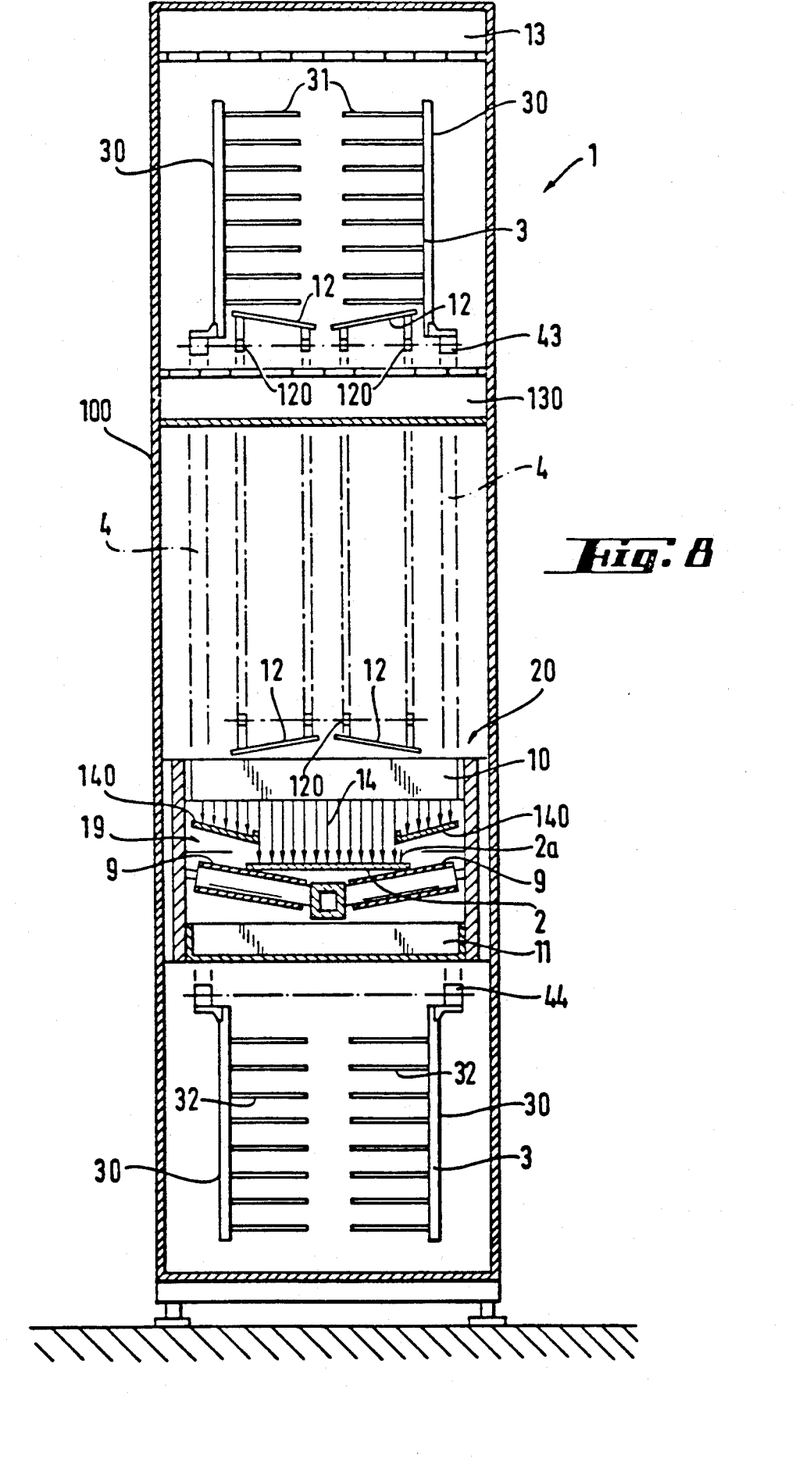
FIG. 8 is a sectional view along line VIII—VIII in FIG. 6 of the transport device, with the integrated lacquering station and supporting device being indicated.

As already mentioned and shown in FIGS. 6 and 7, there is provided as the advancing means for the plurality of holders 3 arranged thereon at constant intervals an endlessly circulating pulling element which, therefore, is able to transmit forces in the pulling direction but is unable or hardly able to do so transversely thereto or in the pressing direction, this advancing means being in the case of the embodiment the chains 4 which have already been mentioned. Correspondingly stable belts, cables or the like are also possible. It becomes clear especially in FIG. 6 that the bars 30 of the holders 3 project outwardly approximately at a right angle to the length and direction of movement of the chains 4, the free ends of the bars 30 remote from the supporting device 12 pointing away from the chains 4. Thus, the holders 3 and their bars 30 are able to move at the turning points from their otherwise parallel position with respect to each other into an angled position relative to each other without any problem, that is to say are able to go with the turn.

The transport device 1 according to the invention has a number of treatment stations for the circuit boards 2, which are integrated in a very small space within a housing 100. Arranged downstream of a preferably "V"-shaped feed roller conveyor 8 is a centering station 18. The latter comprises a preferably "V"-shaped roller conveyor 180 and a centering rake 181 which is arranged at each side of the roller conveyor and is horizontally displaceable, for example hydraulically, perpendicular to the direction of advance V. In this manner, even the occasional twisted board 2 can be exactly aligned and centered. Arranged downstream of the centering station 18 is the lacquering station 20. The latter comprises a pouring table 9 of conventional construction arranged above the lower run 44 of the advancing chain 4. Arranged above the pouring table 9 is a pouring head 10 for pouring the lacquer 14 preferably in the form of a curtain. Adjustable (not shown) width-defining means 140 define the width of the pouring curtain 14 and allow the lacquer-free edge 2a to be produced on the circuit boards 2. Arranged beneath the pouring table 9 is a collecting device 11 for excess lacquer. Upstream and downstream of the lacquering station 20, partition plates 19 are preferably arranged.

Arranged downstream of the lacquering station in the direction of advance V is an insertion roller conveyor 23. The insertion roller conveyor 23 comprises a number of drivable roller pairs which are preferably inclined to each other in a "V" shape at an angle corresponding to the obtuse angle at which the prongs 31 or 32 of a pair of bars 30 are inclined to each other. The distance between the pairs of rollers and the overall width of the roller conveyor 23 is such that the prongs 31, 32 of a holder 3 are able to pass unhindered between the pairs of rollers. By means of this insertion roller conveyor 23 the coated boards 2 are inserted into the holders 3.

The holders 3 are then transported by the endlessly circulating advancing chain 4 first of all vertically through the pre-drying station 5, then horizontally through the drying station 6 and finally vertically again through the cooling station 7. The entire process of pre-drying and venting, drying, and subsequent cooling and after-drying thus takes place substantially above the lacquering station 20. Within that region, the housing 100 has, arranged in the interior thereof, air supply and air exhaust devices in the form of air supply channels 13 at the outer ends of the holders 3, through which the hot or cold air can be blown into the drying region, and exhaust channels 130 in the region of the bottom ends of the holders 3, inside the endlessly circulating supporting device 12. In this manner, the drying and cooling air is passed between the holders 3 substantially parallel to the boards 2. Impairment of the air flow by the link conveyors of the supporting device 12 is to a large extent avoided by the perforation of the individual links. In the case of endlessly circulating cables or chains spaced from one another to form the supporting device 12 there is in any case hardly any fear of the air flow being impaired.

Approximately at the level of the lower third of the vertical upward movement of the holders 3, the supporting device 12 is guided towards the open, bottom end of each holder 3 in order to close off that end and support the transported boards 2 during the horizontal transport through the drying station 6 as well as during the transition from the vertical to the horizontal transport of the holders 3. The lower turn of the endlessly circulating supporting device occurs approximately in the lower third of the vertical transport of the holders 3, with the result that the bottom ends of the holders 3, which ends are towards the chains, are freed again and are open at a removal roller conveyor 22 which is connected downstream of the cooling station 7 and upstream of the feed roller conveyor 8. The construction of the removal roller conveyor 22 is analogous to that of the insertion roller conveyor 23 and allows the circuit boards 2 to be removed from the holders 3 in a simple and non-damaging manner. The empty holders 3 are transported, in the lower run 44 of the endlessly circulating advancing chain 4, horizontally beneath the feed roller conveyor 8, the centring station and the pouring table 9 to the insertion roller conveyor 23 again.

Figure 9:
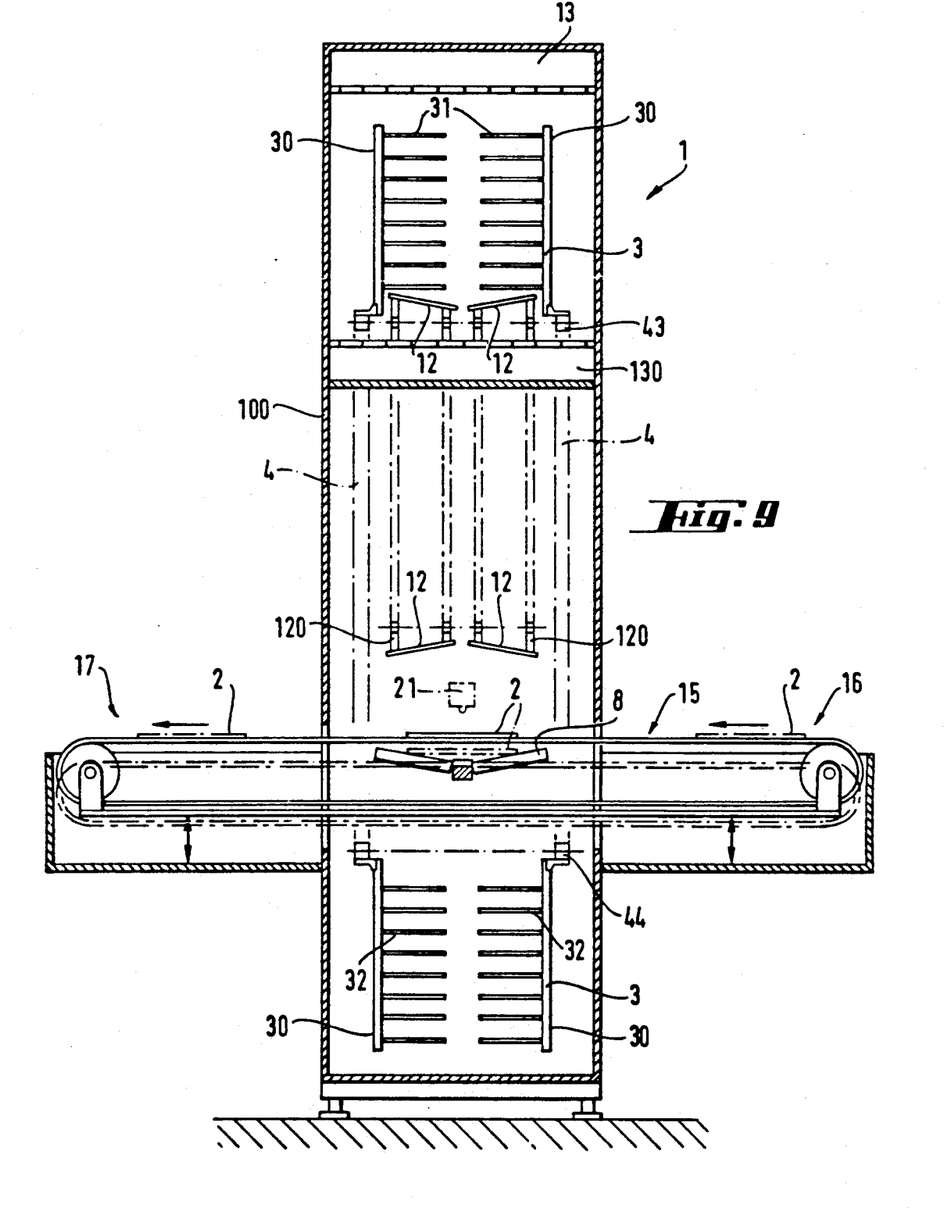
FIG. 9 is a sectional view along line IX—IX in FIG. 6 end view of the transport device, with transverse conveyers for the insertion and discharge of boards being indicated.

The feed roller conveyor 8 is connected to an insertion and a discharge station 16 and 17, respectively. Arranged between the pairs of rollers, which are preferably arranged in a "V" shape, are transverse conveyors 15 which can be raised and lowered, for example hydraulically, respectively above and below the transport level of the feed roller conveyor 8. These transverse conveyors 15 are preferably constructed as belts or cables endlessly circulating between the pairs of rollers. FIG. 9 shows symbolically an endlessly circulating lifting belt 15 in the raised (continuous line) and in the lowered (dot-dash line) position. The transport level of the "V"-shaped pairs of rollers of the feed roller conveyor 8 is also indicated. In the raised position of the transverse conveyor 15, a board 2 can be inserted into the transport device 1 via the insertion station 16 or moved out of the transport device 1 to the discharge station 17. Using these transverse conveyors 15, the transport device 1 can be combined with other systems in a simple manner. Only the transfer devices may have to be adapted. In most cases, however, even this minor adaptation operation could probably be omitted, since standardised roller conveyors are normally used in connection with the transport of circuit boards.

The operation of the transport device according to the invention will be explained in detail below with reference to the passage of a circuit board through that device.

At the insertion station 16, the circuit board 2 is taken by the raised transverse conveyor 15, preferably lifting belts, from transfer devices, not shown, of other systems. The circuit board 2 is transported by the lifting belts 15, in steps, into the interior of the housing 100 of the transport device and is lowered onto the feed roller conveyor 8 by lowering the lifting belts 15. From there, the circuit board 2 is transported in the direction of advance V to the centring station 18 where it is exactly aligned and centered. After being centered, the circuit board 2 passes to the pouring table 9 of the lacquering station 20 where, usually accelerated to a higher speed, it is transported under and through the defined-width lacquer curtain 14. Its surface is thereby coated with lacquer (usually photo-sensitive lacquer), the width definition 140 of the lacquer curtain 14 providing for the lacquer-free edge 2a. Of course, the lacquer could alternatively be sprayed on, for example applied in an electrostatic spraying process of known kind. At the exit from the lacquering station 20, the circuit board 2, which has been coated on one side, is transported to a "V"-shaped insertion roller conveyor 23. On the insertion roller conveyor 23, the circuit board 2 is transferred to a holder 3. For that purpose, a holder 3 is stepped by the advancing means 4 into a position in which the upper prongs 31 of the bars 30 are above the rollers of the insertion roller conveyor 23 and the lower prongs 32 of the bars 30 are slightly below. Preferably, the lower prongs 32 and the pairs of rollers are matched with regard to their obtuse angle of inclination. After the circuit board 2 has been inserted into the holder 3 through the open, bottom portion which is towards the chains, in the next step it is lifted up by the holder 3, the next holder 3 being stepped into the insertion position. During the vertical transport through the pre-drying and venting station 5, the horizontally transported circuit board 2 rests on the lower prongs 32 only by the outer edges of the uncoated side. Approximately in the first third of the vertical transport of the holders 3 and approximately at the entrance to the pre-drying and venting station 5, the open, bottom ends are closed off by the endlessly circulating supporting device 12. At the transition from the stepped vertical transport to the stepped horizontal transport of the holders 3, the latter assume the vertical position and the circuit boards 2 may slide downward slightly until they are supported on the supporting device 12. In this manner, the circuit boards 2 that have been coated on one side are transported in the vertical position through the drying station 6. At the upper turning point 42 at the exit from the drying station 6, the holders 3 are turned again into a vertically downward transport direction. The prongs 31 that were previously the upper prongs are then the lower prongs and the prongs 32 that were previously the lower prongs are then the upper prongs. At the same time, the circuit board 2 that has been coated on one side and dried is turned so that it then rests by the lacquer-free edge 2a on the prongs 31. Resting in this manner, the circuit board 2 is transported through the after-drying and cooling station 7. Approximately in the lower third of the vertical transport of the holders 3 and approximately at the exit from the after-drying and cooling station 7, the endlessly circulating supporting device 12 is turned and thus frees the open, bottom end of the holders 3 which is towards the chains. The holder 3, together with the turned circuit board 2, is moved in steps to the removal roller conveyor 22. In so doing, the holder 3 is stepped into a position in which the circuit board 2 is already resting on the rollers of the removal roller conveyor 22 which are inclined in a "V" shape, but the prongs 32 that are then the upper prongs are still above the transport level. The removal roller conveyor 22 is then set in motion and the circuit board 2, with the coated side down, is advanced in the direction of the feed roller conveyor 8 and out through the open, bottom end of the holders 3 which is towards the chains. A sensor device 21, preferably an optical detector, is preferably arranged immediately in front of the feed roller conveyor 8, which detector detects the condition (coated, uncoated) of the surface of the circuit board. As desired, the detector generates a control signal and passes it to a control system which is not shown in the Figures. The latter decides whether the circuit board 2 will pass through the transport device 1 for a second time, for example in order to coat also the second surface, or whether the circuit board 2 will be moved out of the transport device 1. In the latter case, the circuit board 2 is lifted from the feed roller conveyor 8 by raising the lifting belts 15 and is transported to the discharge station 17 where it may be transferred to further transfer devices not shown.

Overall, therefore, there is produced a transport device 1, having an integrated lacquering station 20, in which boards 2 can be handled in a non-damaging manner. The circuit boards 2 are transported through the entire transport device 1 in steps. In order to treat the coating on the circuit boards with the best possible care after it has been applied, the boards 2 are to be touched by the various transport means only at their longitudinal edges 2a, if possible. For that reason, all of those transport means are preferably of "V"-shaped construction. Owing to their construction, the holders 3 are able in a simple manner to receive the circuit boards after a first coating operation, and transport, hold and turn them during airing, drying and cooling. The boards can also be removed from the holders again without any problem and without any risk to the surface coating and may, if necessary, be returned to the lacquering station 20. During the horizontal transport of the holders 3 with the circuit boards 2 standing vertically therein, the latter are supported by their bottom ends 2b on an endlessly circulating supporting device 12 which frees the open, bottom ends of the holders 3 which are towards the chains, before the circuit boards 2 are inserted and removed. Since, owing to the special construction of the holders 3, the boards 2 are able to lie loosely therein, thus experiencing only edge contact and indeed, in the case of prongs of round cross-section, only point contact, there is no need to operate any complicated clamps, clips or the like or transfer them when changing individual operating stations. Since the holders 3 circulate on the chains 4, they automatically execute a turning movement, with the result that it is not necessary to have two lacquering stations with drying devices located between them in order to coat both sides, but both coatings can be applied in one and the same integrated lacquering station 20 and with the aid of only one, integrated, drying device 5, 6, 7. Altogether, therefore, not least of all the advantageous construction of the holders 3, in conjunction with the endlessly circulating supporting device 12, allows the transport device 1 to be constructed as a circulating coating system in one line in a manner that is space-saving and productive in terms of its expenditure on machinery.

What is claimed is:

1. A transport device for boards or board-shaped workpieces, which are wet-coated with plastics material, and then dried, said device having holders for taking hold of said boards at the edges thereof when handling them and advancing means for transporting them to and through processing stations, said holder having at least two parallel bars on each of which there are provided two rows of prongs arranged in the form of a rake, said prongs of one row of a bar forming an acute angle with those of a second row of said bar, thus being arranged in a "V" shape with respect to each other when viewed in cross-section, and free ends of said prongs of the one bar pointing in the direction of free ends of said prongs of said other bar, and wherein, at least over part of a region located between said bars, a gap between said rows of prongs has a width which increases towards a longitudinal middle plane between said two parallel bars and is greater than a thickness of said board to be held, wherein said holders have open bottom ends to form a loading and unloading opening for said boards, and said transport device further has a supporting device for said boards which is arranged in a region of said bottom ends of said holders and is movable synchronously with said holders.

2. A device according to claim 1, wherein immediately at or adjacent to said bar said width of said gap between said respective rows of prongs arranged in a "V" shape with respect to each other is smaller than said thickness of said board, at a transition point said width is the same as said thickness of said board and, adjacent thereto—closer to said longitudinal middle plane of said holder—said width is greater than said thickness of said board.

3. A device according to claim 1, wherein said prongs of said row are arranged parallel to one another and at right angles to said bar and in each case two prongs extending at an acute angle approximately from the same point on said bar lie in a plane arranged at right angles to the length of said bars.

4. A device according to claim 1, wherein said two bars with their rows of prongs arranged in a "V" shape and pointing towards each other are arranged mirror-symmetrically with respect to said longitudinal middle plane extending between said bars.

5. A device according to claim 3, wherein said prongs are straight and bisectors of said acute angles formed by said prongs of said one bar coincide with those of said angles formed by said prongs of said other bar.

6. A device according to claim 5, wherein said bisectors of said acute angles formed by said prongs of each bar lie in a common plane with said bars, to which plane said longitudinal middle plane is arranged at a right angle.

7. A device according to claim 6, wherein said space between said prongs arranged adjacent to one another in a row is greater than the lateral extent of said prongs.

8. A device according to claim 7, wherein between said free ends of said prongs of said holder, which prongs lie opposite each other in a common plane, a gap is provided which is smaller than the smallest width of said board, and said size of said gap is from one sixth to one quarter, of said distance between said two parallel bars.

9. A device according to claim 8, wherein said gap is adjustable.

10. A device according to claim 1, wherein said supporting device comprises endlessly circulating cables, chains or belts.

11. A device according to claim 10, wherein said supporting device is narrower than said width of said gap between said two bars of said holder.

12. A device according to claim 10, wherein said supporting device comprises two link conveyors inclined at an obtuse angle to each other in a "V" shape.

13. A device according to claim 12, wherein said individual links of said two link conveyors are perforated.

14. A device according to claim 13, wherein said individual links of said link conveyors have a depth which substantially corresponds to the widest spacing of said forward ends of a pair of said prongs, arranged in a "V"-shape, of said bar.

15. A device according to claim 1, wherein said two bars of said holder are connected at their front ends by a connecting piece which is welded on, screwed on or otherwise fastened.

16. A device according to claim 15, wherein said two parallel bars of said holder have fastening or coupling pieces in the region of their bottom ends, for connection to said advancing means for transporting said holders and said boards.

17. A device according to claim 16, wherein there are provided as said advancing means for a plurality of said holders arranged thereon at constant intervals endlessly circulating pulling elements, to the length and direction of movement of which said bars of said holders project outwardly approximately at a right angle, said front ends of said bars pointing away from said pulling elements.

18. A device according to claim 17, wherein said endlessly circulating supporting device and said endlessly circulating advancing means for said holders are coupled at their respective upper turning points.

19. A device according to claim 17, wherein said endlessly circulating advancing means and said endlessly circulating supporting device are guided over common turn rollers which are arranged at their respective upper turning points.

20. A device according to claim 1, which comprises, in the sequence in which said board passes through said device, wherein said processing stations are a feed roller conveyor, a centering station, a lacquering station, an insertion roller conveyor, a drying region and a removal roller conveyor, all of which are integrated in a common housing.

21. A device according to claim 20, wherein said drying region, which comprises a pre-drying and venting station, a drying station and a cooling and after-drying station, is arranged substantially above said lacquering station and said feed roller conveyor.

22. A device according to claim 21, wherein all of said transport means arranged within said individual stations and roller conveyors are substantially "V"-shaped.

23. A device according to claim 22, wherein said transport means arranged beneath said drying region substantially comprise roller lines or conveyor belts inclined at an obtuse angle to each other in a "V" shape, said obtuse angle substantially corresponding to said angle included by said opposing rows of prongs of a pair of said bars of said holder.

24. A device according to claim 21, wherein said pre-drying and venting station substantially extends along said vertically upwardly circulating transport path of said advancing element, said drying station extents along said transport path in said upper run of said advancing element and said after-drying and cooling station substantially extends along said vertically downwardly extending portion of said transport path of said advancing element.

25. A device according to claim 24, wherein approximately in a lower third of said pre-drying and venting station said supporting device is in each case turned towards said bottom ends of said holders and, approximately in a lower third of said after-drying and cooling station, is turned away from said bottom ends of said holders, in the former case closing off said open, bottom end of said holders which is towards said chains, and, in the latter case, freeing them again.

26. A device according to claim 20, wherein said feed roller conveyor comprises a transverse conveyor which is arranged between said pairs of rollers and can be raised above a roller level of said boards and lowered below said roller level, and forms an insertion station and an opposite discharge station, as a point of intersection with transfer stations of other systems.

27. A device according to claim 26, wherein said transverse conveyor is constructed in the form of endlessly circulating lifting belts which can be raised and lowered, preferably hydraulically, and a direction of movement of which is substantially perpendicular to said direction of transport of said boards in said transport device.

28. A device according to claim 20, wherein there is arranged upstream of said feed roller conveyor, viewed in said direction of transport of said boards, a sensor device which activates said transverse conveyor when a predetermined coating state (on one side, on both sides) of said board is detected.

29. A device according to claim 20, wherein, during the transport of said holders by said lower run of the advancing element, which run is movable parallel to said direction of transport of said boards in said lacquering station, said holders hang with their outer, front ends downward and are empty.

30. A device according to claim 20, wherein said lacquering station comprises a curtain-pouring device, the width of a curtain of lacquer being adjustable by width-defining means.

31. A device according to claim 1, wherein said boards or board-shaped workpieces are circuit boards.

32. A device according to claim 1, wherein said plastics material is UV-hardenable.

33. A device according to claim 32, wherein said plastics material is a lacquer.

34. A device according to claim 17, wherein said pulling elements are chains.

35. A device according to claim 17, wherein said pulling elements are belts.

* * * * *